US009175215B2

(12) United States Patent
Sato

(10) Patent No.: US 9,175,215 B2
(45) Date of Patent: Nov. 3, 2015

(54) METHOD FOR PRODUCING PHOSPHOR DISPERSION LIQUID AND METHOD FOR MANUFACTURING LED DEVICE

(71) Applicant: Konica Minolta, Inc., Tokyo (JP)

(72) Inventor: Atsushi Sato, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/408,914

(22) PCT Filed: Aug. 12, 2013

(86) PCT No.: PCT/JP2013/004830
§ 371 (c)(1),
(2) Date: Dec. 17, 2014

(87) PCT Pub. No.: WO2014/027460
PCT Pub. Date: Feb. 20, 2014

(65) Prior Publication Data
US 2015/0140700 A1 May 21, 2015

(30) Foreign Application Priority Data
Aug. 13, 2012 (JP) .................................. 2012-179295

(51) Int. Cl.
*H01L 21/20* (2006.01)
*C09K 11/77* (2006.01)
*C09K 11/02* (2006.01)
(Continued)

(52) U.S. Cl.
CPC .............. *C09K 11/7766* (2013.01); *C09K 11/02* (2013.01); *C09K 11/7721* (2013.01); *H01L 33/50* (2013.01); *H01L 33/502* (2013.01); *H01L 33/507* (2013.01); *H01L 33/56* (2013.01); *H01L 33/0041* (2013.01); *H01L 2224/48091* (2013.01);
(Continued)

(58) Field of Classification Search
None
See application file for complete search history.

(56) References Cited

U.S. PATENT DOCUMENTS

2002/0163302 A1   11/2002  Nitta et al.
2011/0278616 A1* 11/2011  Washizu et al. ................. 257/98
(Continued)

FOREIGN PATENT DOCUMENTS

JP    2001-181614 A    7/2001
JP    2002-314142 A   10/2002
(Continued)

OTHER PUBLICATIONS

Office Action dated Jan. 12, 2015 for the corresponding Korean Patent Application No. 10-2014-7033045 and its English translation.
(Continued)

*Primary Examiner* — Alexander Ghyka
(74) *Attorney, Agent, or Firm* — Lucas & Mercanti, LLP

(57) ABSTRACT

The present invention addresses the problem of providing a method for producing a phosphor dispersion liquid, which is not susceptible to settling of phosphor particles, without deteriorating the phosphor particles. In order to solve the above-mentioned problem, the present invention provides a method for producing a phosphor dispersion liquid that contains phosphor particles, laminar clay mineral particles, oxide microparticles and a solvent, said method comprising: a step of preparing a first dispersion liquid that has a viscosity of 50-500 mPa·s by mixing the laminar clay mineral particles, the oxide microparticles, and the solvent; and a step for mixing the phosphor particles into the first dispersion liquid.

11 Claims, 2 Drawing Sheets

(51) Int. Cl.
*H01L 33/50* (2010.01)
*H01L 33/56* (2010.01)
*H01L 33/00* (2010.01)

(52) U.S. Cl.
CPC ... *H01L 2224/8592* (2013.01); *H01L 2933/005* (2013.01); *H01L 2933/0041* (2013.01)

(56) References Cited

U.S. PATENT DOCUMENTS

| | | | |
|---|---|---|---|
| 2013/0037844 A1* | 2/2013 | Hatano et al. | 257/98 |
| 2013/0125365 A1 | 5/2013 | Goto et al. | |
| 2013/0344633 A1* | 12/2013 | Washizu et al. | 438/29 |
| 2014/0009060 A1* | 1/2014 | Kimura et al. | 313/498 |
| 2014/0119024 A1* | 5/2014 | Yu et al. | 362/294 |
| 2015/0004728 A1* | 1/2015 | Taguchi | 438/29 |
| 2015/0118773 A1* | 4/2015 | Kojima | 438/29 |

FOREIGN PATENT DOCUMENTS

| | | |
|---|---|---|
| JP | 2004-153109 A | 5/2004 |
| JP | 2006-339581 A | 12/2006 |
| JP | 2009-161642 A | 7/2009 |
| WO | WO2011/129320 A1 | 8/2011 |
| WO | WO2011/129320 A1 | 10/2011 |
| WO | WO2012/023425 A1 | 2/2012 |

OTHER PUBLICATIONS

Office Action dated May 29, 2015 from the corresponding Chinese Application No. 201380028146.0.

English translation of Office Action dated May 29, 2015 from the corresponding Chinese Application No. 201380028146.0.

* cited by examiner

METHOD FOR PRODUCING PHOSPHOR DISPERSION LIQUID AND METHOD FOR MANUFACTURING LED DEVICE

CROSS REFERENCE TO RELATED APPLICATION

This Application is a 371 of PCT/JP2013/004830 filed on Aug. 12, 2013 which, in turn, claimed the priority of Japanese Patent Application No. JP2012-179295 filed on Aug. 13, 2012, both applications are incorporated herein by reference.

TECHNICAL FIELD

The present invention relates to a method of producing a phosphor dispersion liquid, and a method of manufacturing an LED device.

BACKGROUND ART

Recently, there has been developed a white LED device with a yellow phosphor such as YAG being disposed in the vicinity of a gallium nitride (GaN)-based blue LED (Light-Emitting Diode) element. In this white LED device, blue light emitted by the blue LED element and yellow light emanated by the phosphor upon receipt of blue light are mixed to obtain white light. Further, there has also been developed a white LED device in which blue light emitted by a blue LED element and red light, green light, or the like emanated by a phosphor upon receipt of blue light are mixed to obtain white light.

In such a white LED device, there is disposed an encapsulating member in which phosphor particles are dispersed in a transparent resin. The specific gravity of phosphor particles contained in the encapsulating member is greater than the specific gravity of the transparent resin. Therefore, there has been a problem in which, at the time of the formation of the encapsulating member, phosphor particles easily settle before curing of the transparent resin, causing the concentration of the phosphor not to be uniform inside the encapsulating member. If the concentration of the phosphor is not uniform, the chromaticity of irradiation light of an LED device is hard to fall within a desired range.

Under such circumstances, it is proposed that, for example, a silicone resin with high viscosity is adopted as an encapsulating resin, making it difficult for phosphor particles to settle (PTL 1). Further, it is also proposed that settling of the phosphor particles is suppressed by: adding a laminar clay compound and an organic cation to an encapsulating resin (PTL 2); and by adding silicone microparticles to an encapsulating resin (PTL 3).

According to the techniques of PTLs 1 to 3, the setting and segregation of phosphor particles can be suppressed to some degree. However, any of the techniques of PTLs 1 to 3 ends up encapsulating phosphor particles with resin. Therefore, there have been a problem in which light and heat from an LED element cause an encapsulating resin to be easily colored and deteriorated.

For these problems, there is proposed a technique in which a composition containing phosphor particles and a ceramic precursor is applied onto an LED element to bind phosphor particles with a ceramic binder. The ceramic binder is stable to light and heat from an LED element. Therefore, coloring or deterioration over time is rare. However, in the composition in which phosphor particles and a ceramic precursor are mixed, there is a case where, if it is stored for a long period of time, the phosphor particles and the ceramic precursor react with each other, causing the ceramic precursor to be gelated, solidified, or the like. Under such circumstances, it is proposed that phosphor particles and a ceramic precursor are applied separately (PTL 4). According to the method described in this literature, 1) a phosphor dispersion liquid containing phosphor particles is applied onto an LED element to form a phosphor particle layer; and thereafter 2) a solution containing a ceramic precursor is applied onto the phosphor particle layer to bind the phosphor particle layer with a translucent ceramic binder. According to this method, there is less risk that a phosphor dispersion liquid or a solution containing a ceramic precursor may be gelated during storage.

CITATION LIST

Patent Literature

PTL 1
Japanese Patent Application Laid-Open No. 2002-314142
PTL 2
Japanese Patent Application Laid-Open No. 2004-153109
PTL 3
Japanese Patent Application Laid-Open No. 2006-339581
PTL 4
WO2012/023425

SUMMARY OF INVENTION

Technical Problem

However, a phosphor dispersion liquid free from a binder component has lower viscosity, causing phosphor particles to easily settle over time. Then, according to the technique of PTL 4, phosphor particles and laminar clay mineral particles are added to a solvent, and these are stirred and mixed with a relatively high shearing force. Thereby, phosphor particles and laminar clay mineral particles are dispersed uniformly, allowing the phosphor particles to be hard to settle. However, there has been a problem in which, when stirring is carried out with a higher shearing force, phosphor particles are pulverized, so that sufficient fluorescence cannot be obtained from the coating of a phosphor dispersion liquid.

The present invention has been achieved taking account of the aforementioned problems. An object of the present invention is to provide a method of producing a phosphor dispersion liquid with phosphor particles being hard to settle without deteriorating phosphor particles.

Solution to Problem

A first aspect of the present invention relates to methods of producing a phosphor dispersion liquid set forth below.

[1] A method of producing a phosphor dispersion liquid including phosphor particles, laminar clay mineral particles, oxide microparticles, and a solvent, the method including:
mixing laminar clay mineral particles, oxide microparticles, and a solvent to prepare a first dispersion liquid having a viscosity of 50 to 500 mPa·s; and
mixing phosphor particles into the first dispersion liquid.

[2] The method according to [1], wherein the mixing of the laminar clay mineral particles, the oxide microparticles, and the solvent in the step of preparing the first dispersion liquid, and the mixing of the first dispersion liquid and the phosphor particles in the step of mixing the phosphor particles are carried out in different devices.

[3] The method according to [1] or [2], wherein the mixing of the first dispersion liquid and the phosphor particles is carried out in any of devices selected from the group consisting of a rotation/revolution stirrer, a vibration stirrer, a tumbler rotary stirrer, a container rotary mixer, and a shaker.

[4] The method according to any of [1] to [3], wherein the solvent is an aliphatic alcohol.

[5] The method according to any of [1] to [4], wherein the laminar clay mineral particles are swellable clay mineral particles.

[6] The method according to any of [1] to [5], wherein the viscosity of the phosphor dispersion liquid is 80 to 1,000 mPa·s.

[7] The method according to [3], further including housing in a shipping container the first dispersion liquid prepared in the step of preparing the first dispersion liquid, wherein the shipping container can be attached to a device for mixing the first dispersion liquid and the phosphor particles, and the mixing of the first dispersion liquid and the phosphor particles in the step of mixing the phosphor particles is carried out in the shipping container.

A second aspect of the present invention relates to methods of manufacturing an LED device set forth below.

[8] A method of manufacturing an LED device, including:

preparing a phosphor dispersion liquid by the producing method according to any of [1] to [7];

applying the phosphor dispersion liquid onto an LED element to form a phosphor layer;

applying a translucent ceramic material composition including a translucent ceramic material and a solvent onto the phosphor layer; and curing the translucent ceramic material to form a wavelength conversion part in which the phosphor layer is bound with a translucent ceramic.

[9] The method according to [8], wherein the translucent ceramic material is polysiloxane.

[10] The method according to [8] or [9], including applying a composition for a transparent resin layer including a transparent resin onto the wavelength conversion part to form a transparent resin layer.

Advantageous Effects of Invention

According to the producing method of the present invention, laminar clay minerals and phosphor particles can be uniformly dispersed, and phosphor particles are hard to settle in a phosphor dispersion liquid to be obtained. On the other hand, at the time of preparing a phosphor dispersion liquid, a shearing force applied to the phosphor particles can be decreased, so that the deterioration of phosphor particles at the time of preparing the phosphor dispersion liquid can be suppressed.

DESCRIPTION OF EMBODIMENTS

Figure 1:
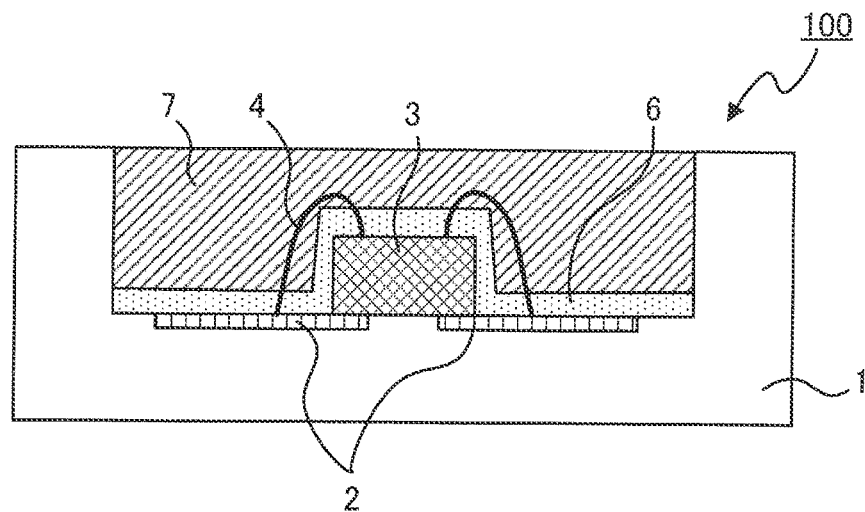
FIG. 1 is a schematic sectional view illustrating an example of an LED device obtained by the manufacturing method of the present invention.

1. Method of Producing Phosphor Dispersion Liquid

According to the producing method of the present invention, a phosphor dispersion liquid containing phosphor particles, laminar clay mineral particles, oxide microparticles, and a solvent is prepared. According to the producing method of the present invention, components other than phosphor particles are mixed earlier, and phosphor particles are mixed afterward. Specifically, the phosphor dispersion liquid is prepared via two steps set forth below.

(1) A step in which laminar clay mineral particles, oxide microparticles, and a solvent are mixed to prepare a first dispersion liquid; and (2) A step in which phosphor particles are mixed into the first dispersion liquid.

It is noted that, according to the producing method of the present invention, a step of housing in a shipping container the first dispersion liquid may be carried out where necessary, after the step of preparing the first dispersion liquid and before mixing the phosphor particles.

According to the conventional method of preparing a phosphor dispersion liquid, a liquid in which all the phosphor particles, laminar clay mineral particles, a solvent, and the like are mixed has been stirred and mixed. At that time, if stirring and mixing are insufficient, then dispersion of phosphor particles and laminar clay mineral particles becomes non-uniform, causing phosphor particles to settle over time. On the other hand, there has been a problem in which, when respective particles are dispersed uniformly by applying a higher shearing force, phosphor particles end up being pulverized, making it difficult to obtain sufficient fluorescence from the coating thereof.

In contrast thereto, according to the present invention, the process of producing phosphor dispersion liquid is divided into two steps. That is, a liquid mixture of materials other than phosphors (a laminar clay compound, oxide microparticles, and a solvent) is mixed to prepare a first dispersion liquid. The liquid mixture does not contain phosphor particles. Accordingly, the respective components can be mixed using a higher shearing force, enabling to prepare a first dispersion liquid in which laminar clay mineral particles and oxide microparticles are uniformly dispersed.

Phosphor particles are then mixed into the first dispersion liquid. The phosphor particles have affinity with the laminar clay mineral particles. Therefore, when phosphor particles are mixed into the first dispersion liquid in which the laminar clay mineral particles are uniformly dispersed, the phosphor particles are attracted to the laminar clay mineral particles, allowing the phosphor particles to be uniformly dispersed. That is, even without applying a higher shearing force, a phosphor dispersion liquid in which phosphor particles are uniformly dispersed can be prepared. Further, in the phosphor dispersion liquid to be obtained, laminar clay mineral particles and phosphor particles are uniformly dispersed, allowing the phosphor particles to be hard to settle even if it is stored for a long period of time.

(1) Step of Preparing First Dispersion Liquid

In the step of preparing the first dispersion liquid, laminar clay mineral particles, oxide microparticles, and a solvent are mixed to prepare a first dispersion liquid.

Laminar Clay Mineral Particles

A laminar clay mineral particle is a particle composed of clay minerals having a laminar structure. The laminar clay mineral particle assumes a plate-like shape. Therefore, when laminar clay mineral particles are contained, the viscosity of the first dispersion liquid to be obtained, and thus that of the phosphor dispersion liquid are increased. Further, as mentioned above, the laminar clay mineral particles have a higher affinity with phosphor particles. Accordingly, when the laminar clay mineral particles are uniformly dispersed in the first dispersion liquid, the dispersibility of the phosphor particles is increased.

Examples of the laminar clay minerals include a laminar silicate mineral, imogolite, allophane, and the like. The laminar silicate mineral is preferably a swellable clay mineral having a mica structure, a kaolinite structure or a smectite structure, and particularly preferably a swellable clay mineral having a smectite structure with good swelling property. Since the swellable clay mineral particles form a card-house structure in a phosphor-containing liquid, the viscosity thereof is increased by allowing only a small amount thereof to be contained in the first dispersion liquid.

Specific examples of the laminar clay minerals include natural or synthetic smectite clay minerals such as hectorite, saponite, stevensite, beidellite, montmorillonite, nontronite, bentonite and laponite, swellable mica clay minerals such as Na tetrasilicicfluorinemica, Li tetrasilicicfluorinemica, Na fluorine taeniolite and Li fluorine taeniolite, non-swellable mica clay minerals such as muscovite, phlogopite, fluorphlogopite, sericite and potassium tetrasilisic mica, and vermiculite or kaolinite, or mixtures thereof.

Examples of commercially available laminar clay mineral particles include: Laponite XLG (synthetic hectorite analogue available from LaPorte Co., UK); Laponite RD (synthetic hectorite analogue available from LaPorte Co., UK); Samabisu (synthetic hectorite analogue available from Henkel, Germany); Sumecton SA-1 (saponite analogue available from KUNIMINE Industry Co., Ltd.); BEN-GEL (natural bentonite available from Hojun Corporation); Kunipia F (natural montmorillonite available from KUNIMINE Industry Co., Ltd.); Veegum (natural hectorite available from Vanderbilt Co., Ltd, US); Daimonaito (synthetic swellable mica available from Topy Industries Ltd.); Somasif (synthetic swellable mica available from CO-OP CHEMICAL CO., LTD.); SWN (synthetic smectite available from CO-OP CHEMICAL CO., LTD.); SWF (synthetic smectite available from CO-OP CHEMICAL CO., LTD.); M-XF (muscovite available from Repco Inc.); S-XF (phlogopite available from Repco Inc.); PDM-800 (fluor-phlogopite available from Topy Industries Ltd.); Sericite OC-100R (sericite available from Ohchem Commerce Co., Ltd.); and PDM-K(G)325 (potassium tetrasilisic mica available from Topy Industries Ltd.).

The laminar clay mineral particles may be those the surface of which is modified (surface-treated) with an ammonium salt or the like. When the surface of the laminar clay mineral particles is modified, the dispersibility of the laminar clay mineral particles in the first dispersion liquid becomes better.

The mean particle diameter of the laminar clay mineral particles is preferably 0.1 to 100 µm, and more preferably 1 to 50 µm. When the size of the laminar clay mineral particles is 0.1 µm or greater, the aforementioned viscosity-improving effect can be easily obtained. On the other hand, when the size of the laminar clay mineral particles is greater than 100 µm, there is a case where the light transmissivity of a coating film of phosphor particles to be finally obtained may be lowered. The size of the laminar clay mineral particles is measured by Coulter counter method, or the like.

The amount of the laminar clay mineral particles to be mixed at the time of preparing the first dispersion liquid is preferably 0.1 to 5 mass % based on the total amount of the first dispersion liquid, and more preferably 0.5 to 4 mass %. When the concentration of the laminar clay mineral particles is less than 0.1 mass %, the viscosity of the first dispersion liquid is not increased sufficiently. On the other hand, when the concentration of the laminar clay mineral particles exceeds 5 mass %, there is a case where the fluidity of the first dispersion liquid is lowered, causing the dispersibility of the phosphor particles to be lowered in the steps described later. Incidentally, it is not that, the more the ratio of the laminar clay mineral particles is increased, the more the viscosity of the first dispersion liquid is increased. The viscosity of the first dispersion liquid is determined depending on the content ratio thereof relative to other components, such as the amount of a solvent, the amount of oxide microparticles, or the like.

Oxide Microparticles

When oxide microparticles are contained in the first dispersion liquid, the viscosity of the first dispersion liquid is further increased. Examples of the oxide microparticles include silicon oxide, titanium oxide, zinc oxide, aluminum oxide, zirconium oxide, and the like. The surface of the oxide microparticles may be treated with a silane coupling agent or a titanium coupling agent.

The oxide microparticles may be porous particles, and the specific surface area thereof is preferably 200 $m^2$/g or greater. When the oxide microparticles are porous, a solvent enters pores, and thus the viscosity of the first dispersion liquid is easily increased. However, the viscosity of the first dispersion liquid is not determined solely by the amount of the oxide microparticles, but also varies depending on the ratio between oxide microparticles and the solvent, the amount of laminar clay mineral particles, or the like.

The mean primary particle diameter of the oxide microparticles is preferably 5 to 100 nm, more preferably 5 to 80 nm, and still more preferably 5 to 50 nm. When the mean primary particle diameter of the oxide microparticles is within these ranges, the viscosity of the first dispersion liquid is easily increased. The mean primary particle diameter of the oxide microparticles is measured by Coulter counter method.

The amount of the oxide microparticles to be mixed at the time of preparing the first dispersion liquid is preferably 1 to 40 mass % based on the total amount of the first dispersion liquid, more preferably 1 to 20 mass %, and still more preferably 1 to 10 mass %. When the amount of the oxide microparticles is too small, the viscosity of the first dispersion liquid to be obtained is not sufficiently increased. On the other hand, when the amount of the oxide microparticles is too large, the amount of the laminar clay mineral particles is low relatively, and thus there is a risk that phosphor particles may settle, or the dispersibility of the phosphor particles may be lowered in a phosphor dispersion liquid to be obtained.

Solvent

Solvents are not particularly limited, as long as laminar clay mineral particles and oxide microparticles can be dispersed. Examples of the solvents include water, organic solvents excellent in compatibility with water, and organic solvents with less compatibility with water. From the viewpoint of the dispersibility of laminar clay mineral particles and oxide microparticles, the viscosity of the first dispersion liquid to be obtained, and the like, the solvents are particularly preferably aliphatic alcohols. The aliphatic alcohol may be a monovalent aliphatic alcohol, or may be a divalent or higher polyvalent aliphatic alcohol. In particular, it is preferable to combine a monovalent aliphatic alcohol and a polyvalent aliphatic alcohol, from the viewpoint of the viscosity of the first dispersion liquid to be obtained, further the viscosity of the phosphor dispersion liquid to be finally obtained, and the like.

When a monovalent aliphatic alcohol is contained, the viscosity of the first dispersion liquid, and further the viscosity of the phosphor dispersion liquid to be finally obtained are easily lowered. Further, the drying property of the coating film of the phosphor dispersion liquid becomes better. Examples of the monovalent aliphatic alcohols include methanol, ethanol, propanol, butanol, and the like. The amount of the monovalent aliphatic alcohol to be mixed at the time of preparing the first dispersion liquid is preferably 20 to 60 mass % based on the total amount of the first dispersion liquid, and more preferably 30 to 50 mass %.

On the other hand, when a polyvalent aliphatic alcohol is contained, the viscosity of the first dispersion liquid, and further the viscosity of the phosphor dispersion liquid to be finally obtained are easily increased. The polyvalent aliphatic alcohol may be either diol or triol. Examples of the polyvalent aliphatic alcohols include ethylene glycol, propylene glycol, diethylene glycol, glycerin, 1,3-butanediol, 1,4-butanediol, and the like, with ethylene glycol, propylene glycol, 1,3-butanediol, 1,4-butanediol and the like being preferable. The amount of the polyvalent alcohol to be mixed at the time of preparing the first dispersion liquid is preferably 30 to 80 mass % based on the total amount of the first dispersion liquid, and more preferably 45 to 65 mass %.

The solvent may contain water. When water is contained, water enters between layers of swellable clay mineral particles which can be laminar clay mineral particles so that the swellable clay mineral particles swell, allowing the viscosity of the first dispersion liquid to be increased more. However, when water contains impurities, there is a risk that the swelling of the swellable clay mineral particles may be inhibited. Thus, in the case of allowing the swellable clay mineral particles to swell, pure water is adopted as water to be mixed.

It is also preferable that solvents include an organic solvent having a boiling point of 150° C. or higher. When the organic solvent having a boiling point of 150° C. or higher is contained, the storage stability of the phosphor dispersion liquid to be finally obtained is improved. On the other hand, the boiling point of the solvent is preferably 250° C. or lower. When the boiling point of the solvent exceeds 250° C., there is a risk that it may become difficult for the solvent to be dried from the coating film of the phosphor dispersion liquid to be finally obtained.

The total amount of the solvent to be mixed at the time of preparing the first dispersion liquid is preferably 55 to 99 mass % based on the total amount of the first dispersion liquid, and more preferably 75 to 98 mass %. When the total amount of the solvent is less than 55 mass %, the viscosity of the first dispersion liquid becomes too high, and thus there is a risk that the phosphor particles may not be able to be dispersed uniformly in the steps described later. On the other hand, when the total amount of the solvent exceeds 99 mass %, the amount of laminar clay mineral particles or oxide microparticles is small relatively, and the viscosity of the first dispersion liquid is not increased sufficiently, so that there is a risk that the phosphor particles mixed in the steps described later may settle.

First Dispersion Liquid

Laminar clay mineral particles, oxide microparticles, a solvent, and other additives where necessary are mixed, and these are sufficiently mixed to obtain a first dispersion liquid. In mixing the respective components, a higher shearing force can be applied to the liquid mixture. By applying a higher shearing force, aggregated particles of the laminar clay mineral particles and the oxide microparticles are crushed, allowing the laminar clay mineral particles and the oxide microparticles to be dispersed more uniformly. The time for stirring the liquid mixture is appropriately adjusted in accordance with the amount of the liquid mixture and the stirring method.

Examples of methods for dispersing the respective components while applying a shearing force include stirring and dispersion using stirring devices such as a stirrer mill, a blade kneader, or a thin-film spin dispersing machine. Specific examples of the stirring devices include: media-less stirring devices such as ULTRA-TURRAX (IKA Co., Ltd.), T.K. Auto Homomixer (Primix Co., Ltd.), T.K. Pipeline Homomixer (Primix Co., Ltd.), T.K. Fill Mix (Primix Co., Ltd.), Cleamix (M Technique Co., Ltd.), Clea SS5 (M Technique Co., Ltd.), Cavitron (Eurotech Co., Ltd.), and Fine Flow Mill (Taiheiyo Kiko K.K.); media stirring devices such as Viscomill (Imex Co., Ltd.), Apex Mill (Kotobuki Industries Co., Ltd.), Star Mill (Ashizawa Fine Tech Co., Ltd.), DCP Super Flow (Nippon Eirich K.K.), MP Mill (Inoue, Ltd.), Spike Mill (Inoue, Ltd.), Mighty Mill (Inoue, Ltd.), and SC mill (Mitsui Kozan K.K.); and high-pressure atomizers such as Ultimizer (Sugino Machine K.K.), Nanomizer (Yoshida Kikai Co., Ltd.), and NANO3000 (Beryu Co., Ltd.). Further, preferable examples also include ultrasonic wave dispersion apparatuses.

The viscosity of the first dispersion liquid to be obtained is 50 to 500 mPa·S, and preferably 70 to 250 mPa·s. When the viscosity of the first dispersion liquid is less than 50 mPa·s, the phosphor particles to be mixed in the steps to be described later easily settle. On the other hand, when the viscosity exceeds 500 mPa·s, the viscosity is too high, and thus the phosphor particles are hard to be dispersed uniformly. The viscosity of the first dispersion liquid is adjusted depending on the time for stirring (dispersing) the liquid mixture or a shearing force at the time of stirring (dispersing). When the shearing force at the time of stirring is made higher, the viscosity of the first dispersion liquid is easily increased. Further, in general, when the time for stirring (dispersing) is shorter, the viscosity of the first dispersion liquid is likely to be lowered. The aforementioned viscosity is a viscosity at the time when the first dispersion liquid is at 25° C., and is a value one minute after a vibrator of a vibration-type viscosity measuring apparatus (VM-10A, available from SEKONIC CORPORATION) is immersed in the liquid.

2) Step of Housing First Dispersion Liquid

After the step of preparing the first dispersion liquid, the first dispersion liquid may be housed in a shipping container before mixing the first dispersion liquid with the phosphor particles. After preparation of the first dispersion liquid, when the first dispersion liquid is housed in the shipping container, phosphor particles can be dispersed in this container in the preparation step of the phosphor dispersion liquid described later. Further, the phosphor dispersion liquid obtained can be shipped as it is, allowing the production loss of the phosphor dispersion liquid to be reduced. The shipping container is a container for storage, transportation, and further delivery.

The types of the shipping container are not particularly limited, as long as it is a container attachable to a device for mixing the phosphor particles and the first dispersion liquid in the preparation step of the phosphor dispersion liquid described later. The container is preferably a container that is highly airtight, and further stable relative to the aforementioned solvent. The container can be, for example, a bottle made of resin, a can made of metal, or the like. Further, the size and shape of the shipping container are appropriately selected in accordance with the amount of shipping, or the like.

The method of housing the first dispersion liquid into the shipping container is not particular limited. For example, the method can be a method, or the like, in which the first dispersion liquid obtained in the aforementioned step is supplied to a filling device, from which it is injected to the shipping container by each desired amount. The first dispersion liquid may be filtrated before being housed into the shipping container.

3) Step of Preparing Phosphor Dispersion Liquid

Phosphor particles are mixed into the first dispersion liquid obtained in the aforementioned step, and the phosphor particles are dispersed uniformly to obtain a phosphor dispersion liquid.

Phosphor Particles

It is sufficient that the phosphor particles are excited by light emitted by an LED chip to emanate fluorescence having a wavelength that is different from that of light emitted by the LED chip. For example, examples of phosphor particles that emanate yellow fluorescence include YAG (yttrium-aluminum-garnet) phosphor, or the like. The YAG phosphor can emanate yellow fluorescence (550 to 650 nm wavelength) upon receipt of blue light (420 to 485 nm wavelength) emitted by blue LED chip 3.

The phosphor particles can be produced for example by the methods including: 1) mixing an appropriate amount of flux (fluoride such as ammonium fluoride) with a mixed raw material having a predetermined composition followed by pressing to produce a molded article; and 2) loading the resulting molded article into a crucible followed by calcination in air at 1,350 to 1,450° C. for 2 to 5 hours to produce a sintered product.

The mixed raw material having a predetermined composition can be produced by fully mixing stoichiometric ratios of oxides of Y, Gd, Ce, Sm, Al, La and Ga or compounds that are easily converted to the oxides at elevated temperatures. Alternatively, the mixed raw material having a predetermined composition can also be produced by the methods including: 1) mixing a solution containing stoichiometric ratios of the rare earth elements Y, Gd, Ce and Sm in acid with oxalic acid to obtain a coprecipitate oxide; and 2) mixing the coprecipitate oxide with aluminum oxide or gallium oxide.

The types of the phosphor are not limited to YAG phosphor; for example, other phosphors, including Ce-free, non-garnet phosphor, can also be available.

The mean particle diameter of the phosphor particles is preferably 1 to 50 μm, and is more preferably 10 μm or less. The larger the particle diameter of the phosphor particles is, the higher luminescence efficiency (wavelength conversion efficiency) becomes. On the other hand, when the particle diameter of the phosphor particles is too large, the gap that occurs between phosphor particles becomes larger in the coating film of the phosphor dispersion liquid to be obtained. Thereby, there is a case where the strength of a phosphor particle layer to be obtained may be lowered. The mean particle diameter of the phosphor particles can be measured, for example, by Coulter counter method.

The amount of the phosphor particles to be mixed into the phosphor dispersion liquid is preferably 10 to 99 mass % based on the total mass of the solid content of the phosphor dispersion liquid, and more preferably 20 to 97 mass %. When the concentration of the phosphor particles is less than 10 mass %, there is a risk that sufficient fluorescence cannot be obtained from the coating film of the phosphor dispersion liquid to be obtained. On the other hand, when the amount of the phosphor particles exceeds 99 mass %, the amount of the laminar clay mineral particles or the amount of the oxide microparticle is small relatively, and thus there is a case where phosphor particles may settle in the phosphor dispersion liquid.

Preparation of Phosphor Dispersion Liquid

Dispersion of the phosphor particles is preferably carried out without applying a higher shearing force to a liquid mixture of the first dispersion liquid and the phosphor particles. When a higher shearing force is applied to the liquid mixture, there is a risk that the phosphor particles may be pulverized, and sufficient fluorescence cannot be obtained from the coating film of the phosphor dispersion liquid. As described above, according to the producing method of the present invention, the laminar clay mineral particles are dispersed uniformly in the first dispersion liquid. Therefore, even without a higher shearing force being applied, the affinity between the laminar clay mineral particles and the phosphor particles allows the phosphor particles to be easily dispersed uniformly. Further, the laminar clay mineral particles and the phosphor particles are dispersed uniformly in the phosphor dispersion liquid, thereby allowing the phosphor particles to be hard to settle.

The dispersion of the phosphor particles is preferably carried out by a method in which phosphor particles and stirring blades or stirring media of the stirrer are not brought into contact with each other. That is, the dispersion of the phosphor particles is preferably carried out with a device different from the device of mixing the respective components in the aforementioned preparation step of the first dispersion liquid.

Further, the dispersion of the phosphor particles is preferably carried out in the shipping container in which the first dispersion liquid is housed. Examples of the devices capable of carrying out dispersion of the phosphor particles include a rotation/revolution stirrer, a vibration stirrer, a tumbler rotary stirrer, a container rotary mixer, a shaker, and the like. Specific examples of the stirring devices include: a rotation/revolution stirrer: Awatori Rentaro (available from THINKY), vibration stirrers: Rocking Shaker (available from Seiwa Giken Co., Ltd.), and Rocking Mill (available from Seiwa Giken Co., Ltd.), a tumbler rotary stirrer: Mix Rotor (available from AS ONE Corporation), container rotary mixers: V-type Blender (available from Nishimura Machine Works Co., Ltd.), and Rocking Mixer (available from Aichi Electric Co., Ltd.), a shaker: Shaking Incubator (available from AS ONE Corporation), and the like.

The time for dispersing the phosphor particles is preferably 1 to 30 minutes, and more preferably 5 to 15 minutes. When the time for dispersing the phosphor particles is excessively long, there is a risk that the phosphor particles may be deteriorated. On the other hand, when the time for dispersing the phosphor particles is excessively short, there is a risk that the phosphor particles may not be uniformly dispersed.

The viscosity of the phosphor dispersion liquid to be obtained is preferably typically 80 to 1,000 mPa·s, and more preferably 200 to 450 mPa·s, although the viscosity is determined appropriately depending on the methods of application the phosphor dispersion liquid. When the viscosity of the phosphor dispersion liquid is less than 80 mPa·s, the phosphor particles easily settle during storing of the phosphor dispersion liquid. On the other hand, when the viscosity exceeds 1,000 mPa·s, the viscosity of the phosphor dispersion liquid is too high, and thus there is a case where it may be difficult to apply the phosphor dispersion particles. The viscosity of the phosphor dispersion liquid is adjusted depending on the stirring time for dispersing the phosphor particles, a shearing force at the time of dispersing, or the like. The aforementioned viscosity is a viscosity at the time when the phosphor dispersion liquid is at 25° C., and is a value one minute after a vibrator of a vibration-type viscosity measuring apparatus (VM-10A, available from SEKONIC CORPORATION) is immersed in the liquid.

2. LED Device

Figure 2:
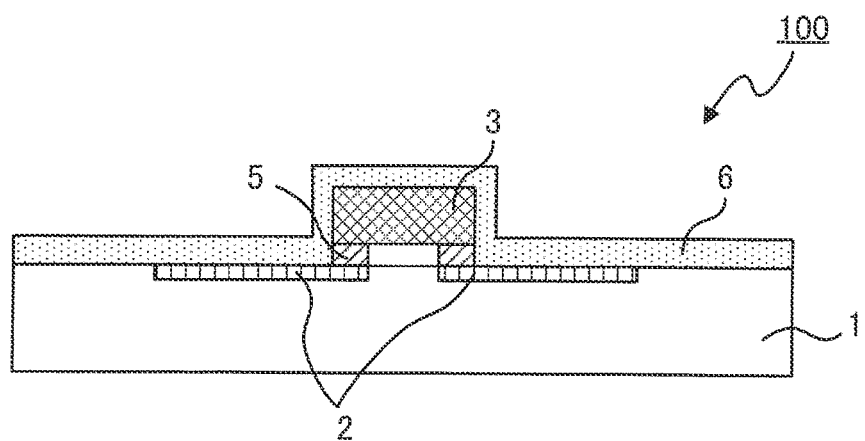
FIG. 2 is a schematic sectional view illustrating another example of an LED device obtained by the manufacturing method of the present invention.

The aforementioned phosphor dispersion liquid is suitable for the formation of a wavelength conversion part of an LED device. The LED device to be formed using the aforementioned phosphor dispersion liquid has an LED element that emits light of specific wavelength, and a wavelength conversion part that is formed on the LED element and converts light from the LED element to light of another specific wavelength. On the wavelength conversion part, there may be formed an arbitrary layer such as a transparent resin layer. FIGS. 1 and 2 are sectional views illustrating examples of LED device 100. The LED device illustrated in FIG. 1 includes an LED element having LED chip 3, wavelength conversion part 6 formed on the LED device, and transparent resin layer 7.

(1) LED Element

LED device 100 illustrated in FIG. 1 has package (LED substrate) 1, metal part 2, LED chip 3, and interconnection 4 that connects metal part 2 and LED chip 3.

While package 1 can be made, for example, of a liquid crystal polymer or a ceramic, the material thereof is not particularly limited as long as it has an insulating property and heat resistance. Also, the shape thereof is not particularly limited; for example, it may have a recess as illustrated in FIG. 1, or it may also have a flat shape as illustrated in FIG. 2.

The luminescence wavelength of LED chip 3 is not particularly limited. LED chip 3 may emanate, for example, blue light (a light of about 420 to 485 nm), and may emanate ultraviolet light.

The configuration of LED chip 3 is not particularly limited. When the luminescent color of LED chip 3 is blue, LED chip 3 can be a laminate of an n-GaN compound semiconductor layer (cladding layer), an InGaN compound semiconductor layer (light emitting layer), a p-GaN compound semiconductor layer (cladding layer), and a transparent electrode layer. LED chip 3 can have an emission surface of 200 to 300 µm×200 to 300 µm, for example. LED chip 3 typically has a height of about 50 to 200 µm.

Metal part 2 can be an interconnection made of metal such as silver. Metal part 2 may function as a reflection plate that reflects light, or the like emitted by LED chip 3. Metal part 2 and LED chip 3 may be connected to each other through interconnection 4 as illustrated in FIG. 1, or may be connected to each other through bump electrode 5 as illustrated in FIG. 2. The mode in which metal part 2 and LED chip 3 are connected through interconnection 4 is called wire-bonding, and the mode in which they are connected through bump electrode 5 is called flip-chip bonding.

LED device 100 as illustrated in FIGS. 1 and 2 only has one LED chip 3 being disposed in package 1; however a plurality of LED chips 3 may also be disposed in package 1.

(2) Wavelength Conversion Part

Wavelength conversion part 6 is a layer to which the phosphor particles are bound with a translucent ceramic. Wavelength conversion part 6, upon receipt of a specific wavelength light (excitation light) emitted by LED chip 3, emanates another specific wavelength light (fluorescence). Mixing of excitation light with fluorescence allows the light from LED device 100 to be a desired light. For example, when the light emitted by LED chip 3 is blue and the fluorescence emanated by phosphor particles contained in wavelength conversion part 6 is yellow or orange, the light from LED device 100 becomes white.

It is sufficient that wavelength conversion part 6 covers the emission surface of LED chip 3, and it is not necessary that it thoroughly covers package 1, metal part 2, interconnection 4, or the like. While the thickness of wavelength conversion part 6 is not particularly limited, the thickness is preferably typically 15 to 300 µm, and more preferably 30 to 200 µm. When the thickness of wavelength conversion part 6 is too large, there is a risk that a crack may occur in wavelength conversion part 6. On the other hand, when the thickness of wavelength conversion part 6 is too small, there is a possibility that sufficient phosphor particles may not be contained in wavelength conversion part 6, resulting in sufficient fluorescence not being obtained. The thickness of wavelength conversion part 6 means the maximum thickness of wavelength conversion part 6 formed on the emission surface of LED chip 3. The thickness of wavelength conversion part 6 is measured with a laser holographic gauge.

(3) Transparent Resin Layer

Transparent resin layer 7 is formed so as to cover wavelength conversion part 6. Transparent resin layer 7 protects the LED element or wavelength conversion part 6 from the outer impact, gas, or the like. Further, if wavelength conversion part 6 is included, then a light coupling-out efficiency is also easily increased. The transparent resin layer is a layer that contains a transparent resin and has higher transparency to visible light.

Examples of the transparent resin include silicone resins such as epoxy-modified silicone resin, alkyd-modified silicone resin, acryl-modified silicone resin, polyester-modified silicone resin, and phenyl silicone resins; epoxy resins; acryl resins; methacryl resins; urethane resins; and the like. In particular, phenyl silicone resins are preferable. When the transparent resin is phenyl silicone resin, the wet resistance of the LED device is increased.

While the thickness of transparent resin layer 7 is not particularly limited, it is preferably typically 25 µm to 5 mm, and more preferably 1 to 3 mm. Generally, it is difficult to set the thickness of transparent resin layer 7 to 25 µm. On the other hand, from the viewpoint of downsizing the LED device, the thickness of transparent resin layer 7 is preferably 5 mm or less.

3. Method of Manufacturing LED Device

The manufacturing method of the aforementioned LED device includes the following six steps:

1) preparing a phosphor dispersion liquid by the aforementioned method;
2) providing an LED element;
3) applying the aforementioned phosphor dispersion liquid to form a phosphor particle layer;
4) applying a translucent ceramic material composition including a translucent ceramic material and a solvent onto the phosphor particle layer;
5) curing the translucent ceramic material; and
6) applying a composition for a transparent resin layer including a transparent resin to form a transparent resin layer.

According to the manufacturing method of the present invention, the aforementioned phosphor dispersion liquid is applied onto an LED element to form a phosphor layer. A translucent ceramic material composition is applied onto the phosphor layer, and then the translucent ceramic material is cured, thereby binding the phosphor layer with the translucent ceramic material.

In the phosphor dispersion liquid prepared by the aforementioned method, phosphor particles are hard to settle, so that uniform dispersion state is easily maintained. Therefore, even if the phosphor dispersion liquid is retained for a long period of time in, for example, a coating liquid tank of an applicator, the phosphor particles in the phosphor dispersion liquid are uniformly dispersed. As a result, the concentration of phosphors in the phosphor dispersion liquid to be applied to the LED element becomes constant at the initial and terminal stages of the applying operation. Further, in the phosphor dispersion liquid prepared by the aforementioned method, the phosphor particles are not deteriorated. Accordingly, an LED device that emits irradiation light with desired chromaticity can be obtained.

1) Step of Providing Phosphor Dispersion Liquid

With the aforementioned method, components other than phosphor particles (laminar clay mineral particles, oxide microparticles, and a solvent) are mixed to prepare a first dispersion liquid, and phosphor particles are mixed into the first dispersion liquid to prepare a phosphor dispersion liquid.

2) Step of Providing LED Element

In the step of providing an LED element, the aforementioned LED element is provided. For example, it can include steps of: electrically connecting a metal part formed in a package and an LED chip with each other; fixing the LED chip to the package; and the like.

3) Step of Applying Phosphor Dispersion Liquid

The aforementioned phosphor dispersion liquid is applied so as to cover a metal part (metal interconnection) of the aforementioned LED element and the emission surface of the LED chip to form a phosphor particle layer on the LED element.

The phosphor dispersion liquid is applied so as to cover the emission surface of the LED chip. The means for application is not particularly limited. Examples of the methods of applying the phosphor dispersion liquid include conventionally known methods such as bar-coating method, spin coating method, spray coating method, dispensing method, and jet-dispensing method. When the phosphor dispersion liquid is applied with a spray applicator, or the like described later, the thickness of the phosphor particle layer can be smaller.

The amount of application of the phosphor-containing composition is appropriately adjusted depending on the thickness of the phosphor particle layer. The thickness of the phosphor particle layer is preferably 15 to 300 μm, and more preferably 30 to 200 μm. When the thickness of the phosphor particle layer is less than 15 μm, there is a risk that the amount of the phosphor particles may become smaller, resulting in sufficient fluorescence not being obtained. On the other hand, when the thickness of the phosphor particle layer exceeds 300 μm, the concentration of the phosphor particles in the phosphor particle layer becomes excessively low, and thus there is a risk that the concentration of the phosphor particles may not be uniform. The thickness of the phosphor particle layer means the maximum thickness of the phosphor particle layer formed on the emission surface of the LED chip. The thickness of the phosphor particle layer is measured with a laser holographic gauge.

The solvent in the phosphor dispersion liquid is preferably dried after application of the phosphor dispersion liquid. The temperature at the time of drying the solvent in the phosphor dispersion liquid is typically 20 to 200° C., and preferably 25 to 150° C. When the temperature is lower than 20° C., there is a possibility that the solvent may not be sufficiently volatilized. On the other hand, when the temperature exceeds 200° C., there is a possibility that it may adversely affect the LED chip. In addition, the time for drying is typically 0.1 to 30 minutes, and preferably 0.1 to 15 minutes, from the viewpoint of manufacturing efficiency.

Spray Applicator for Phosphor Dispersion Liquid

Figure 3:
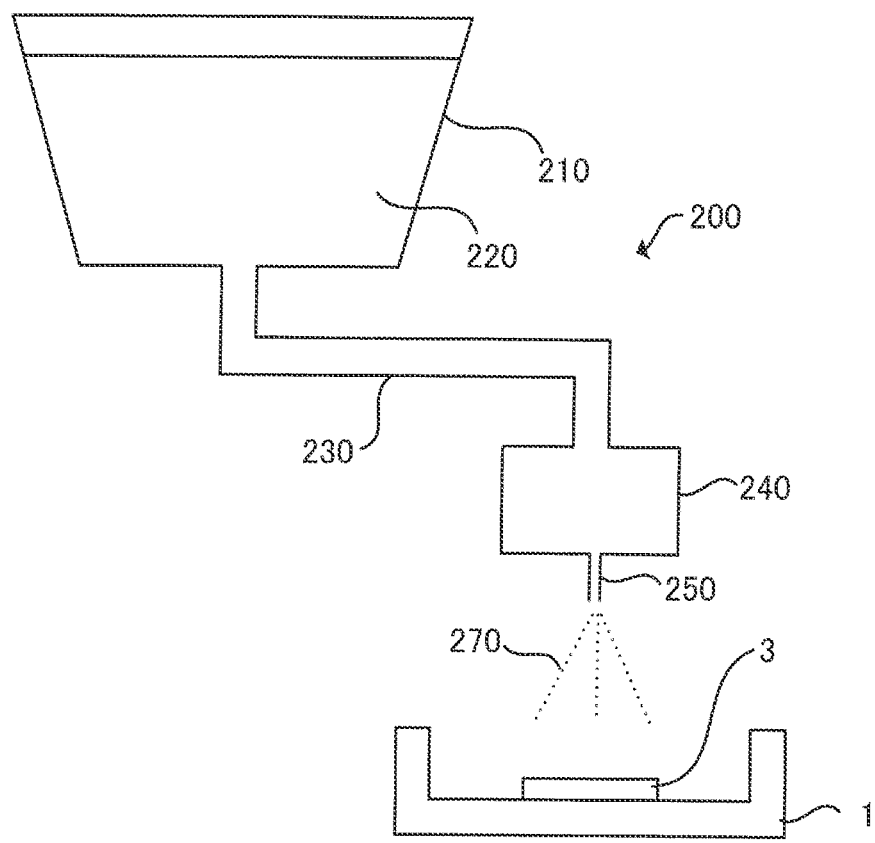
FIG. 3 is a schematic sectional view illustrating an example of a sprayer that applies a phosphor dispersion liquid obtained by the present invention.

The spray applicator preferably includes a coating liquid tank that retains a phosphor dispersion liquid, a head having a nozzle for discharging a coating liquid, and a connector tube that allows fluid communication between the coating liquid tank and the nozzle. FIG. 3 illustrates the outline of the spray applicator for applying the coating liquid.

The phosphor dispersion liquid is loaded into coating liquid tank 210 in applicator 200 illustrated in FIG. 3. Phosphor dispersion liquid 220 inside coating liquid tank 210 in applicator 200 illustrated in FIG. 3 is pressurized and supplied to head 240 through connector tube 230. Phosphor dispersion liquid 220 supplied to head 240 is discharged from nozzle 250, and is applied to the coating target (LED chip 3). In the case of a spray applicator, discharging of coating liquid 270 from nozzle 250 is carried out by means of wind pressure. Nozzle 250 may be configured to have an openable and closable port at the tip thereof, so that ON/OFF of the discharging operation is controlled by opening or closing the port.

In the step of applying the phosphor dispersion liquid, operations and condition settings of the following (1) to (9) are carried out.

(1) Basically, the tip of nozzle 250 is disposed immediately above LED chip 3 to spray phosphor dispersion liquid 220 from immediately above LED chip 3. In accordance with the shape of LED chip 3, phosphor dispersion liquid 220 may be sprayed from immediately above LED chip 3, or may be sprayed from diagonally above LED chip 3. Spraying from diagonally above enables phosphor dispersion liquid 220 to be adequately applied to the entire surface of LED chip 3. It is preferable to uniformly apply phosphor dispersion liquid 220 also to the lateral surface of LED chip 3 in this manner.

(2) The spraying amount of phosphor dispersion liquid 220 is made constant, and the amount of phosphors per unit area is made constant. The variation of the spraying amount of phosphor dispersion liquid 220 over time is set to be within 10%, and preferably within 1%.

(3) The temperature of nozzle 250 is adjusted, and the viscosity of phosphor dispersion liquid 220 at the time of spraying is adjusted. Preferably, the temperature of phosphor dispersion liquid 220 is adjusted to be 40° C. or lower, or is adjusted in accordance with the viscosity of phosphor dispersion liquid 220. In this case, LED substrate (package) 1 of the LED element may be placed under room temperature environment, or the temperature of LED substrate 1 of the LED element may also be controlled by providing a temperature adjusting mechanism on a moving table. When the temperature of LED substrate 1 is set higher at 30 to 100° C., an organic solvent in phosphor dispersion liquid 220 sprayed to LED substrate 1 can be volatilized quickly, enabling to prevent phosphor dispersion liquid 220 from dripping from LED substrate 1. Conversely, when the temperature of LED substrate 1 is set lower at 5 to 20° C., the solvent can be volatilized slowly, enabling phosphor dispersion liquid 220 to be uniformly applied along the outer wall of LED chip 3. Thus, the film density and the film strength of the phosphor particle layer can be enhanced, enabling to form a dense film.

(4) The environmental atmosphere (temperature/humidity) of applicator 200 is made constant, to stabilize the spraying of phosphor dispersion liquid 220.

(5) A mask may be disposed between applicator 200 and the LED element in accordance with the shape of LED chip 3, to spray phosphor dispersion liquid 220 via the mask. For the mask, it is necessary to use a material not dissolving into a solvent constituting phosphor dispersion liquid 220; from the viewpoint of collecting materials such as phosphors adhering to the mask, combustible one is preferably used.

(6) When the spraying and application of phosphor dispersion liquid 220 to one LED element is completed, the operation similar to the above is repeated for the following LED element, to sequentially spray and apply phosphor dispersion liquid 220 onto LED chip 3 of a plurality of LED elements. In this case, regardless of switching of LED elements, phosphor dispersion liquid 220 may be continued to be continuously sprayed, or the spraying of phosphor dispersion liquid 220 may be temporarily suspended for every switching of the LED elements to spray phosphor dispersion liquid 220 intermittently. When phosphor dispersion liquid 220 is continued to be continuously sprayed, the spraying amount of phosphor dispersion liquid 220 for each LED element can be stabilized. When phosphor dispersion liquid 220 is sprayed intermittently, the amount of phosphor dispersion liquid 220 to be used can be saved.

(7) During the steps of spraying/application, for each time when the spraying and application of phosphor dispersion liquid 220 to a certain number of LED elements are completed, the chromaticity and luminance of white light may be actually inspected, to feed back the inspection results to the spraying amount, spraying pressure, spraying temperature, and the like of phosphor dispersion liquid 220.

(8) During the steps of spraying/application, nozzle 250 may be cleaned. In this case, a cleaning tank in which a cleaning liquid is retained is disposed in the vicinity of sprayer 200, and the tip of nozzle 250 is immersed in the cleaning tank during suspension of the spraying of phosphor dispersion liquid 220 or during inspection of the chromaticity and luminance of white light, to prevent the tip of nozzle 250 from being dried. In addition, during suspension of the steps of spraying and application, there is a risk that phosphor dispersion liquid 220 may be cured to cause a spraying port of nozzle 250 to be clogged, and thus it is preferable that nozzle 250 is immersed in the cleaning tank, or nozzle 250 is cleaned at the time of initiating the steps of spraying and application.

(9) In the steps of spraying and application, phosphor dispersion liquid 220 is sprayed in the form of mist, and thus, when an organic solvent in phosphor dispersion liquid 220 is volatilized, there is a case where powder such as phosphor particles or oxide microparticles may be scattered. Therefore, spraying/application steps and inspection step are carried out preferably while collecting dust and discharging air through a filter with applicator 200 being entirely covered with a housing or the like. When phosphor particles are trapped with a filter, expensive phosphor particles can be reused.

4) Step of Applying Translucent Ceramic Material Composition

The translucent ceramic material composition is applied so as to cover the aforementioned phosphor particle layer. The translucent ceramic material composition enters a gap in the phosphor particle layer to fill the gap of phosphor particles, laminar clay mineral particles, oxide microparticles, and the like contained in the phosphor particle layer.

The translucent ceramic material composition contains a translucent ceramic material and a solvent, and contains inorganic particles, or the like, where necessary.

Translucent Ceramic Material

The translucent ceramic material may be a compound that becomes a translucent ceramic (preferably a glass ceramic) by a sol-gel reaction. Examples of the translucent ceramic material include metal alkoxides, metal acetylacetonates, metal carboxylates, polysilazane oligomers, and the like, with metal alkoxides being preferable from the viewpoint of good reactivity.

The metal alkoxides can be various metal alkoxides, but are preferably alkoxysilane or aryloxysilane from the viewpoint of the stability and manufacturing easiness of the translucent ceramic to be obtained.

The alkoxysilane or aryloxysilane may be a monomolecular compound (monomer) such as tetraethoxysilane, but is preferably polysiloxane (oligomer). The polysiloxane is a compound obtained through linear or cyclic siloxane bonding of silane compounds. The preparation method of polysiloxane will be described later.

The mass mean molecular weight of polysiloxane is preferably 1,000 to 3,000, more preferably 1,200 to 2,700, and still more preferably 1,500 to 2,000. When the mass mean molecular weight of polysiloxane is less than 1,000, there is a risk that the viscosity of the translucent ceramic material composition may be too low. On the other hand, when the mass mean molecular weight exceeds 3,000, the viscosity of the translucent ceramic material composition becomes higher, and there is a case where it may be difficult to apply the translucent ceramic material composition. The mass mean molecular weight is a value measured by gel permeation chromatography (in terms of polystyrene).

When the translucent ceramic material is polysiloxane, the amount of polysiloxane contained in the translucent ceramic material composition is preferably 1 to 40 mass % based on the total mass of the translucent ceramic material composition, and more preferably 2 to 30 mass %. When the amount of polysiloxane is less than 1 mass %, there is a risk that a cured product of polysiloxane may not bind phosphor particles, and the like sufficiently. On the other hand, when the amount of polysiloxane exceeds 40 mass %, the viscosity of the translucent ceramic material composition becomes excessively high, and there is a case where it may be difficult to apply the translucent ceramic material composition.

Solvent

The translucent ceramic material composition contains a solvent. It is sufficient that the solvent can dissolve or uniformly disperse the aforementioned translucent ceramic material. Examples of the solvent include: monovalent aliphatic alcohols such as methanol, ethanol, propanol, and n-butanol; alkyl carboxylic acid esters such as methyl-3-methoxy propionate, and ethyl-3-ethoxy propionate; polyvalent aliphatic alcohols such as ethylene glycol, diethylene glycol, propylene glycol, glycerin, trimethylol propane, and hexane triol; polyvalent aliphatic alcohol monoethers such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether, or monoacetates thereof; polyvalent alcohol ethers obtained by alkyl-etherifying all of hydroxyl groups of polyvalent aliphatic alcohols such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methylethyl ether; esters such as methyl acetate, ethyl acetate, and butyl acetate; ketones such as acetone, methyl ethyl ketone, and methyl isoamyl ketone; and the like. Only one type of solvent or two or more types of solvents may be contained in the translucent ceramic material composition.

It is preferable that the solvents include water. The amount of water is preferably 3 to 15 mass % based on the total mass of the translucent ceramic material composition, and more preferably 5 to 10 mass %. When the translucent ceramic material is polysiloxane, the water content is preferably 10 to 120 mass parts based on 100 mass parts of polysiloxane, and more preferably 80 to 100 mass parts. When the amount of water contained in the translucent ceramic material composition is too small, there is a case where polysiloxane may not be sufficiently hydrolyzed after application of the translucent ceramic material. On the other hand, when the amount of water contained in the translucent ceramic material composition is excessive, there is a risk that hydrolysis, or the like may occur during storing of the translucent ceramic material composition, causing the translucent ceramic material composition to be gelated.

It is also preferable that the solvents include organic solvents (e.g., ethylene glycol, propylene glycol) having a boiling point of 150° C. or higher. When an organic solvent having a boiling point of 150° C. or higher is contained, the storage stability of the translucent ceramic material composition is increased. Further, the solvent is hard to be volatilized in the applicator, and thus the translucent ceramic material composition can be stably applied from the applicator.

On the other hand, the boiling point of the solvent contained in the translucent ceramic material composition is preferably 250° C. or lower. When the boiling point of the solvent exceeds 250° C., there is a risk that it may take time to dry the translucent ceramic material composition, or that the solvent may not be dried sufficiently.

Inorganic Particles

The translucent ceramic material composition may contain inorganic particles. When inorganic particles are contained in the translucent ceramic material composition, at the time when the translucent ceramic material composition is cured, a stress occurring on the film is alleviated, making it difficult for a crack to occur in the wavelength conversion part.

While the types of the inorganic particles are not particularly limited, it is preferable that the refractive index of the inorganic particles is higher than the refractive index of the translucent ceramic materials (e.g., polysiloxane, polysilazane). When inorganic particles having a higher refractive index are contained in the translucent ceramic material composition, the refractive index of the resulting wavelength conversion part is increased. In general, the refractive index of the LED element (LED chip) is considerably high compared with that of the translucent ceramic material. Then, when the refractive index of the wavelength conversion part is increased, the difference in the refractive index between the LED element and the wavelength conversion part becomes smaller, leading to less reflection of light at the interface between the LED element and the wavelength conversion part. That is, the light coupling-out efficiency of the LED device is increased.

The inorganic particles are preferably porous particles, and the specific surface area thereof is preferably 200 m$^2$/g or higher. When the inorganic particles are porous, a solvent enters pores, allowing the viscosity of the translucent ceramic material composition to be increased. However, the viscosity of the translucent ceramic material composition is not determined depending solely on the amount of inorganic particles, but also varies depending on the ratio between inorganic particles and a solvent, the amount of other components, or the like.

The mean primary particle diameter of the inorganic particles is preferably 5 to 100 nm, more preferably 5 to 80 nm, and still more preferably 5 to 50 nm. When the mean primary particle diameter of the inorganic particles is 100 nm or less, they easily enter a gap between phosphor particles of the phosphor particle layer formed in the aforementioned step 2). Further, when the mean primary particle diameter of the inorganic particles is 5 nm or greater, the aforementioned crack suppression effect and refractive index-improving effect are easily obtained. The mean primary particle diameter of the inorganic particles is measured by Coulter counter method.

Examples of inorganic particles include zirconium oxide, titanium oxide, tin oxide, cerium oxide, niobium oxide, zinc oxide, and the like. Among these, the inorganic particles are preferably zirconium oxide microparticles. Only one type of inorganic particle or two or more types of inorganic particles may be contained in the translucent ceramic material composition.

The inorganic particles may be those the surface of which is treated with a silane coupling agent or a titanium coupling agent. The surface-treated inorganic particles are easily dispersed uniformly in the translucent ceramic material composition.

The amount of the inorganic particles in the translucent ceramic material composition is preferably 10 to 60 mass % based on the total amount of the solid content of the translucent ceramic material composition, more preferably 15 to 45 mass %, and still more preferably 20 to 30 mass %. When the amount of the inorganic particles is too small, the aforementioned crack suppression effect is not increased, and the refractive index-improving effect does not become sufficient, either. On the other hand, when the amount of the inorganic particles is too large, the amount of the translucent ceramic material (binder) is decreased relatively, so that there is a risk that the binding of the phosphor particles with a transparent ceramic may be insufficient, or that the strength of the wavelength conversion part may be lowered.

Application of Translucent Ceramic Material Composition

The method of applying the translucent ceramic material composition is not particularly limited. Example thereof can be blade application, spin coating application, dispenser application, and spray application; according to the spray application, it is possible to form a wavelength conversion part with smaller thickness. The spray applicator can be similar to a spray applicator to be used for the application of the aforementioned phosphor dispersion liquid.

The amount of application of the translucent ceramic material composition is set to be an amount that is capable of sufficiently binding phosphor particles, laminar clay mineral particles, oxide microparticles, and the like contained in the phosphor particle layer. When the amount of application of the translucent ceramic material composition is too small, the phosphor particles may not be sufficiently bound, and thus there is a risk that the strength of the wavelength conversion part may be lowered.

Method of Preparing Polysiloxane (Translucent Ceramic Material)

Polysiloxane which is a translucent ceramic material to be added to the translucent ceramic material composition can be obtained by polymerizing an alkoxysilane compound or an aryloxysilane compound. The alkoxysilane compound or aryloxysilane compound is represented, for example, by the following general formula (II):

$$\text{Si(OR)}_n Y_{4-n} \tag{II}$$

In the general formula (II), n represents the number of an alkoxy group or an aryloxy group (OR), and is an integer of 2 or more and 4 or less. Further, R represents, each independently, an alkyl group or a phenyl group, and preferably represents an alkyl group having 1 to 5 carbon atoms, or a phenyl group.

In the aforementioned general formula (II), Y represents a hydrogen atom, or a monovalent organic group. Specific examples of the monovalent organic group represented by Y include an aliphatic group, an alicyclic group, an aromatic group, and an alicyclic aromatic group having 1 to 1,000, preferably 500 or less, more preferably 100 or less, still more preferably 50 or less, and particularly preferably 6 or less carbon atoms. The monovalent organic group may be a group in which an aliphatic group, an alicyclic group, an aromatic group, and an alicyclic aromatic group are linked via a linking group. The linking group may be an atom such as O, N or S, or an atomic group containing these atoms. Further, the monovalent organic group represented by Y may have a substituent. Examples of the substituent include: halogen atoms such as F, Cl, Br and I; and organic functional groups such as a vinyl group, a methacryloxy group, an acryloxy group, a styryl group, a mercapto group, an epoxy group, an epoxycyclohexyl group, a glycidoxy group, an amino group, a cyano group, a nitro group, a sulfonate group, a carboxy group, a hydroxy group, an acyl group, an alkoxy group, an imino group, and a phenyl group.

In the general formula (II), it is preferable that a group represented by Y is particularly a methyl group. When Y is a methyl group, the light resistance and the heat resistance of the wavelength conversion part become better.

The alkoxysilane or aryloxysilane represented by the aforementioned general formula (II) includes the following tetrafunctional silane compounds, trifunctional silane compounds, and bifunctional silane compounds.

Examples of the tetrafunctional silane compounds include: tetraalkoxysilanes, tetraaryloxysilanes, or the like such as tetramethoxysilane, tetraethoxysilane, tetrapropoxysilane, tetrabutoxysilane, tetrapentyloxysilane, tetraphenyoxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane. Among these, tetramethoxysilane and tetraethoxysilane are preferable.

Examples of the trifunctional silane compounds include: monohydrosilane compounds such as trimethoxysilane, triethoxysilane, tripropoxysilane, tripentyloxysilane, triphenyloxysilane, dimethoxymonoethoxysilane, diethoxymonomethoxysilane, dipropoxymonomethoxysilane, dipropoxymonoethoxysilane, dipentyloxylmonomethoxysilane, dipentyloxymonoethoxysilane, dipentyloxymonopropoxysilane, diphenyloxylmonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monopentyloxydiethoxysilane, and monophenyloxydiethoxysilane; monomethylsilane compounds such as methyltrimethoxysilane, methyltriethoxysilane, methyltripropoxysilane, methyltripentyloxysilane, methylmonomethoxydiethoxysilane, methylmonomethoxydipropoxysilane, methylmonomethoxydipentyloxysilane, methylmonomethoxydiphenyloxysilane, methylmethoxyethoxypropoxysilane, and methylmonomethoxymonoethoxymonobutoxysilane; monoethylsilane compounds such as ethyltrimethoxysilane, ethyltripropoxysilane, ethyltripentyloxysilane, ethyltriphenyloxysilane, ethylmonomethoxydiethoxysilane, ethylmonomethoxydipropoxysilane, ethylmonomethoxydipentyloxysilane, ethylmonomethoxydiphenyloxysilane, and ethylmonomethoxymonoethoxymonobutoxysilane; monopropylsilane compounds such as propyltrimethoxysilane, propyltriethoxysilane, propyltripentyloxysilane, propyltriphenyloxysilane, propylmonomethoxydiethoxysilane, propylmonomethoxydipropoxysilane, propylmonomethoxydipentyloxysilane, propylmonomethoxydiphenyloxysilane, propylmethoxyethoxypropoxysilane, and propylmonomethoxymonoethoxymonobutoxysilane; and monobutylsilane compounds such as butyltrimethoxysilane, butyltriethoxysilane, butyltripropoxysilane, butyltripentyloxysilane, butyltriphenyloxysilane, butylmonomethoxydiethoxysilane, butylmonomethoxydipropoxysilane, butylmonomethoxydipentyloxysilane, butylmonomethoxydiphenyloxysilane, butylmethoxyethoxypropoxysilane, and butylmonomethoxymonoethoxymonobutoxysilane. Among these, methyltrimethoxysilane and methyltriethoxysilane are preferable, and methyltrimethoxysilane is more preferable.

Specific examples of the bifunctional silane compounds include: dimethoxysilane, diethoxysilane, dipropoxysilane, dipentyloxysilane, diphenyloxysilane, methoxyethoxysilane, methoxypropoxysilane, methoxypentyloxysilane, methoxyphenyloxysilane, ethoxypropoxysilane, ethoxypentyloxysilane, ethoxyphenyloxysilane, methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, and the like. Among these, dimethoxysilane, diethoxysilane, methyldimethoxysilane, and methyldiethoxysilane are preferable.

Polysiloxane is prepared by a method of hydrolyzing the aforementioned silane compound in the presence of an acid catalyst, water, and an organic solvent, followed by a condensation reaction. The mass mean molecular weight of polysiloxane can be adjusted depending on reaction conditions (in particular, reaction time), or the like.

At that time, a tetrafunctional silane compound and a trifunctional compound or a bifunctional compound may be mixed in advance at a desired molar ratio to polymerize them randomly. Further, it may also be possible to polymerize a trifunctional silane compound or a bifunctional silane compound alone to some degree to obtain an oligomer, and then polymerize only a tetrafunctional silane compound with the oligomer to obtain a block copolymer.

It is particularly preferable that the acid catalyst for the preparation of polysiloxane is an organic sulfonic acid represented by the following general formula (III):

$$R_8\text{—}SO_3H \quad (III).$$

In the aforementioned general formula (III), a hydrocarbon group represented by $R_8$ is a linear, branched or cyclic, saturated or unsaturated hydrocarbon group having 1 to 20 carbon atoms. Examples of a cyclic hydrocarbon group include an aromatic hydrocarbon group such as a phenyl group, a naphthyl group, or an anthryl group, with a phenyl group being preferable. Further, the hydrocarbon group represented by $R_8$ in the general formula (III) may have a substituent. Examples of the substituent include: a linear, branched or cyclic, saturated or unsaturated hydrocarbon group having 1 to 20 carbon atoms; halogen atoms such as a fluorine atom; a sulfonate group; a carboxyl group; a hydroxyl group; an amino group; a cyano group; and the like.

The organic sulfonic acid represented by the aforementioned general formula (III) is particularly preferably nonafluorobutane sulfonic acid, methanesulfonic acid, trifluoromethane sulfonic acid, or dodecylbenzenesulfonic acid.

The amount of the acid catalyst to be added at the time of preparing polysiloxane is preferably 1 to 1,000 mass ppm based on the total amount of a polysiloxane preparation liquid, and more preferably 5 to 800 mass ppm.

Depending on the amount of water to be added at the time of preparing polysiloxane, the property of a calcined product of polysiloxane varies. Therefore, it is preferable to adjust water addition ratio at the time of preparing polysiloxane, depending on a target property. The water addition ratio is a ratio (%) of the molar number of a water molecule to be added, based on the molar number of an alkoxy group or an aryloxy group of a silane compound contained in a polysiloxane preparation liquid. The water addition ratio is preferably 50 to 200%, and more preferably 75 to 180%. By setting the water addition ratio to 50% or higher, the property of the wavelength conversion part is stabilized. Further, by setting it to 200% or lower, the storage ability of the translucent ceramic material composition becomes better.

Examples of a solvent to be added at the time of preparing polysiloxane include: monovalent aliphatic alcohols such as methanol, ethanol, propanol, and n-butanol; alkylcarboxylic acid esters such as methyl-3-methoxy propionate, and ethyl-3-ethoxy propionate; polyvalent aliphatic alcohols such as ethylene glycol, diethylene glycol, propylene glycol, glycerin, trimethylolpropane, and hexanetriol; polyvalent aliphatic alcohol monoethers such as ethyleneglycol monomethylether, ethyleneglycol monoethylether, ethyleneglycol monopropylether, ethyleneglycol monobutylether, diethyleneglycol monomethylether, diethyleneglycol monoethylether, diethyleneglycol monopropylether, diethyleneglycol monobutylether, propyleneglycol monomethylether, propyleneglycol monoethylether, propyleneglycol monopropylether, and propyleneglycol monobutylether, or monoacetates thereof; esters such as methyl acetate, ethyl acetate, and butyl acetate; ketones such as acetone, methyl ethyl ketone, and methyl isoamyl ketone; polyvalent alcohol ethers obtained by alkyl-etherifying all of hydroxyl groups of polyvalent alcohols such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methylethyl ether; and the like. One type of these may be added alone, or two or more types of these may be added.

5) Step of Curing Translucent Ceramic Material

After application of the translucent ceramic material composition, the translucent ceramic material composition is dried and cured. By curing the translucent ceramic material composition, it becomes possible to obtain a wavelength conversion part in which a phosphor particle layer is bound with the translucent ceramic material.

The method of drying/curing the translucent ceramic material is appropriately selected depending on the types of the translucent ceramic material. For example, when the translucent ceramic material is polysiloxane, a coating film is heated preferably to 100° C. or higher, and is heated more preferably to 150 to 300° C. In the case where the translucent ceramic material is polysiloxane, when the heating temperature is lower than 100° C., the moisture occurring at the time of dehydration condensation cannot be sufficiently removed, and thus there is a risk that the light resistance of the wavelength conversion part may be lowered.

6) Step of Applying Composition for Transparent Resin Layer

A composition for a transparent resin layer containing a transparent resin may be applied onto the aforementioned wavelength conversion part to form a transparent resin layer.

The transparent resin contained in the composition for the transparent resin layer is not particularly limited as long as it is a curable resin, or the like which is transparent to visible light, and the aforementioned various transparent resins can be adopted. The composition for the transparent resin layer may contain a solvent where necessary. The types of the solvent are appropriately selected depending on the types of the transparent resin or the viscosity of the composition for the transparent resin layer.

The method of application of the composition for the transparent resin layer is not particularly limited, and, for example, an application method using a general applicator such as a dispenser can be adopted. Further, the curing method and the curing condition of the composition for the transparent resin layer are appropriately selected depending on the types of the transparent resin. One example of the curing method includes thermal curing.

EXAMPLES

The present invention will now be described in more detail with reference to Examples, which however shall not be construed as limiting the scope of the present invention.

[Preparation of Phosphor Particles]

The phosphor particles to be used for Examples and Comparative Examples were prepared as follows:

As phosphor materials, 7.41 g of $Y_2O_3$, 4.01 g of $Gd_2O_3$, 0.63 g of $CeO_2$, and 7.77 g of $Al_2O_3$ were used. These phosphor particles were sufficiently mixed, and a suitable amount of ammonium fluoride (flux) was further mixed. The mixture was charged into a crucible made of aluminum, and was calcined for 2 to 5 hours at a temperature range of 1,350 to 1,450° C. in a reducing atmosphere under hydrogen-containing nitrogen gas flow. The composition of the resulting calcined product was $(Y_{0.72}Gd_{0.24})_3Al_5O_{12}:Ce_{0.04}$.

The resulting calcined product was pulverized, washed, separated and dried to obtain yellow phosphor particles having a volume mean particle diameter of about 1 μm. An excitation light having a wavelength of 465 nm was irradiated to the obtained yellow phosphor particles to measure a wavelength of the light emanated by the yellow phosphor particles.

As a result, the yellow phosphor particles had a peak wavelength at a wavelength of roughly 570 nm.

[Provision of LED Element]

For an LED element, there is provided an LED chip-mounted package (LED element) with one blue LED chip (cuboid shape; 200×300×100 μm) being flip-chip mounted at the center of a housing part of a round package (opening diameter: 3 mm, bottom diameter: 2 mm, wall angle: 60°).

(Preparation of Phosphor Dispersion Liquid)

Sample 1

3 g of BEN-GEL (available from Hojun Corporation: natural bentonite) as laminar clay mineral particles and 4.5 g of SILYSIA 470 (available from Fuji Silysia Chemical Ltd.) as oxide microparticles were added into a mixed solvent of 70 g of propylene glycol, 30 g of 1,3-butanediol and 50 g of iso-propyl alcohol. The liquid mixture was mixed so as to have a viscosity of 45 mPa·s using TK Auto Homomixer (available from PRIMIX Corporation) to obtain a first dispersion liquid. The viscosity of the first dispersion liquid was adjusted with the dispersing time of the liquid mixture and with a shearing force at the time of dispersion.

Subsequently, 90 g of phosphor particles were added to the first dispersion liquid. The mixture was stirred and mixed using Awatori Rentaro (available from THINKY) to obtain a phosphor dispersion liquid. The viscosity of the obtained phosphor dispersion liquid was 100 mPa·s.

Sample 2

A liquid mixture of laminar clay mineral particles, oxide microparticles and a solvent having the same composition as that for Sample 1 was mixed so as to have a viscosity of 55 mPa·s using TK Auto Homomixer (available from PRIMIX Corporation) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 130 mPa·s.

Sample 3

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 280 mPa·s.

Sample 4

A liquid mixture of laminar clay mineral particles, oxide microparticles and a solvent having the same composition as that for Sample 1 was mixed so as to have a viscosity of 450 mPa·s using TK Auto Homomixer (available from PRIMIX Corporation) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 510 mPa·s.

Sample 5

A liquid mixture of laminar clay mineral particles, oxide microparticles and a solvent having the same composition as that for Sample 1 was mixed so as to have a viscosity of 550 mPa·s using TK Auto Homomixer (available from PRIMIX Corporation) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 600 mPa·s.

Sample 6

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed using TK Auto Homomixer (available from PRIMIX Corporation) to obtain a phosphor dispersion liquid. The viscosity of the obtained phosphor dispersion liquid was 230 mPa·s.

Sample 7

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed using Rocking Mixer (available from Aichi Electric Co., Ltd.) to obtain a phosphor dispersion liquid. The viscosity of the obtained phosphor dispersion liquid was 260 mPa·s.

Sample 8

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed using Rocking Mill (available from Seiwa Giken Co., Ltd.) to obtain a phosphor dispersion liquid. The viscosity of the obtained phosphor dispersion liquid was 260 mPa·s.

Sample 9

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed using Mix Rotor (available from AS ONE Corporation) to obtain a phosphor dispersion liquid. The viscosity of the obtained phosphor dispersion liquid was 270 mPa·s.

Sample 10

A liquid mixture of laminar clay mineral particles, oxide microparticles and a solvent having the same composition as that for Sample 1 was mixed so as to have a viscosity of 200 mPa·s using TK Auto Homomixer (available from PRIMIX Corporation) to obtain a first dispersion liquid.

Subsequently, 90 g of phosphor particles were added to the first dispersion liquid. The mixture was stirred and mixed using Shaking Incubator (available from AS ONE Corporation) to obtain a phosphor dispersion liquid. The viscosity of the obtained phosphor dispersion liquid was 240 mPa·s.

Sample 11

4 g of BEN-GEL (available from Hojun Corporation: natural bentonite) as laminar clay mineral particles and 4 g of Microbead SP-1 (available from JGC Catalysts and Chemicals Ltd.) as oxide microparticles were added to a mixed solvent of 100 g of propylene glycol and 50 g of ethanol. The liquid mixture was mixed so as to have a viscosity of 280 mPa·s using TK Filmix (available from PRIMIX Corporation) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 400 mPa·s.

Sample 12

2.5 g of Micromica MK-100 (available from CO-OP CHEMICAL Co., Ltd.: synthetic mica) as laminar clay mineral particles and 4 g of AEROSIL RX300 (available from Nippon Aerosil Co., Ltd.) as oxide microparticles were added into a mixed solvent of 90 g of 1,3-butanediol and 60 g of isopropyl alcohol. The liquid mixture was mixed so as to have a viscosity of 250 mPa·s using Apex Mill (Kotobuki Industries Co., Ltd.) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 350 mPa·s.

Sample 13

3 g of Kunipia F (available from KUNIMINE Industry Co., Ltd.: montmorillonite) as laminar clay mineral particles and 4.5 g of Nipsil SS-50F (available from Tosoh Silica Corporation) as oxide microparticles were added into a mixed solvent of 70 g of propylene glycol, 30 g of 1,3-butanediol and 50 g of isopropyl alcohol. The liquid mixture was mixed so as to have a viscosity of 200 mPa·s using Cleamix (M Technique Co., Ltd.) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 280 mPa·s.

Sample 14

3 g of Lucentite SWN (available from CO-OP CHEMICAL CO., LTD.: smectite) as laminar clay mineral particles and 4 g of Microbead SP-1 (available from JGC Catalysts and Chemicals Ltd.) as oxide microparticles were added into a mixed solvent of 90 g of 1,3-butanediol, 30 g of isopropyl alcohol and 30 g of ethanol. The liquid mixture was mixed so as to have a viscosity of 180 mPa·s using Nanomizer (Yoshida Kikai Co., Ltd.) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 250 mPa·s.

Sample 15

4 g of Lucentite SWN (available from CO-OP CHEMICAL CO., LTD.: smectite) as laminar clay mineral particles and 5 g of Sylysia 470 (Fuji Silysia Chemical Ltd.) as oxide microparticles were added into a mixed solvent of 40 g of propylene glycol, 40 g of 1,3-butanediol and 80 g of isopropyl alcohol. The liquid mixture was mixed so as to have a viscosity of 150 mPa·s using ULTRA-TURRAX (IKA Co., Ltd.) to obtain a first dispersion liquid.

Subsequently, 90 g of phosphor particles were added to the first dispersion liquid. The mixture was stirred and mixed under the same condition as that for Sample 1 to obtain a phosphor dispersion liquid. The viscosity of the obtained phosphor dispersion liquid was 200 mPa·s.

Sample 16

3 g of BEN-GEL (available from Hojun Corporation: natural bentonite) as laminar clay mineral particles, 4.5 g of Sylysia 470 (Fuji Silysia Chemical Ltd.) as oxide microparticles and 90 g of phosphor particles were added to a mixed solvent of 70 g of propylene glycol, 30 g of 1,3-butanediol and 50 g of isopropyl alcohol. The liquid mixture was dispersed using TK Auto Homomixer (available from PRIMIX Corporation) to obtain a phosphor dispersion liquid. The viscosity of the obtained phosphor dispersion liquid was 250 mPa·s.

Sample 17

3 g of BEN-GEL (available from Hojun Corporation: natural bentonite) as laminar clay mineral particles, 4.5 g of Sylysia 470 (Fuji Silysia Chemical Ltd.) as oxide microparticles and 90 g of phosphor particles were added to a mixed solvent of 70 g of propylene glycol, 30 g of 1,3-butanediol and 50 g of isopropyl alcohol. The mixture was dispersed using Awatori Rentaro (available from THINKY) to obtain a phosphor dispersion liquid. The viscosity of the obtained phosphor dispersion liquid was 60 mPa·s.

Sample 18

A liquid mixture of laminar clay mineral particles, oxide microparticles and a solvent having the same composition as that for Sample 1 was dispersed using Awatori Rentaro (available from THINKY) to obtain a first dispersion liquid. The viscosity of the obtained first dispersion liquid was 30 mPa·s.

Subsequently, 90 g of phosphor particles were added to the first dispersion liquid. The mixture was stirred and mixed using TK Auto Homomixer (available from PRIMIX Corporation) to obtain a phosphor dispersion liquid. The viscosity of the obtained phosphor dispersion liquid was 180 mPa·s.

Sample 19

A liquid mixture of laminar clay mineral particles, oxide microparticles and a solvent having the same composition as that for Sample 1 was dispersed using Awatori Rentaro (available from THINKY) to obtain a first dispersion liquid. The viscosity of the obtained first dispersion liquid was 30 mPa·s.

Subsequently, 90 g of phosphor particles were added to the first dispersion liquid. The mixture was stirred and mixed using Awatori Rentaro (available from THINKY) to obtain a phosphor dispersion liquid. The viscosity of the obtained phosphor dispersion liquid was 60 mPa·s.

[Evaluation]

Measurement of Viscosity

For the measurement of the viscosity of the first dispersion liquids prepared in Samples 1 to 15, 18 and 19, and of the viscosity of the phosphor dispersion liquids prepared in Samples 1 to 19, a vibration-type viscosity measuring apparatus VM-10A (available from SEKONIC CORPORATION) was used to read a value one minute after the immersion of a vibrator in the liquid. The measurement results are shown in Tables 1 and 2.

Evaluation of Settling 5 ml of each of the phosphor dispersion liquids prepared in Samples 1 to 19 was charged into a glass bottle of 15 mm inner diameter. The liquids were allowed to stand at room temperature for 10 days. The thickness of a supernatant layer generated after being allowed to stand was measured with a scale. The measurement results are given in Tables 1 and 2.

Evaluation of Chromaticity Variation (Manufacture of LED Device)

The phosphor dispersion liquids prepared in Samples 1 to 19 were applied to the inside of the recess of the aforementioned LED element using a spray applicator. The conditions for the spray application were set such that the spraying pressure was 0.2 MPa and the relative movement speed between the spray nozzle and the emitting light element from the LED element was 100 mm/s. After the application of the phosphor dispersion liquid, heating was carried out at 150° C. for 1 hour to form a phosphor layer.

Subsequently, a translucent ceramic material composition was spray-applied onto the phosphor layer. For the translucent ceramic material composition, there was adopted a liquid mixture of 15 mass parts of tetramethoxysilane KBM04 (available from Shin-Etsu Chemical Co., Ltd.), 5 mass parts of methyltrimethoxysilane KBM13 (available from Shin-Etsu Chemical Co., Ltd.), 40 mass parts of isopropyl alcohol, 40 mass parts of ethanol, and 2 mass parts of hydrochloric acid.

The conditions for the spray application were set such that the spraying pressure was 0.1 MPa and the relative movement speed between the spray nozzle and the emitting light element from the LED element was 100 mm/s. After the application of the translucent ceramic material composition, heating was carried out at 150° C. for 1 hour to obtain a wavelength conversion part with a phosphor layer being bound thereto with a translucent ceramic.

Further, phenyl silicone (available from Shin-Etsu Chemical Co., Ltd.; KER-6000) was applied onto the wavelength conversion part with a dispenser, and heating was carried out at 150° C. for 1 hour. Thereby, a transparent resin layer with a thickness of 2 mm was formed.

(Measurement of Chromaticity)

Five LED devices were produced using the phosphor dispersion liquids prepared in Samples 1 to 19. For each LED device, the chromaticity was measured. For a measuring device, spectroradiometer CS-1000A (available from Konica Minolta Sensing, Inc.) was adopted.

For each sample, a standard deviation of the chromaticity of five LED devices was calculated. Based on the standard deviation, evaluation was carried out as follows. The results are given in Tables 1 and 2.

A: The standard deviation is 0.01 or less
B: The standard deviation is more than 0.01, and 0.02 or less
D: The standard deviation is more than 0.02

Evaluation of Total Luminous Flux Value

Phosphor particles, oxide microparticles, and laminar clay mineral particles in the same amounts as the amounts contained in the phosphor dispersion liquid of each sample, and a silicone resin (available from Shin-Etsu Chemical Co., Ltd.; KER-6000) were mixed, and each component was allowed to be dispersed in the silicone resin using Awatori Rentaro (500 rpm; 10 minutes). LED devices (samples) were produced according to the method similar to those mentioned above using the respective phosphor dispersion liquids. For the LED devices of the samples, spectroradiometer CS-200 (available from Konica Minolta Sensing, Inc.) was used for measurement.

On the other hand, LED devices (the same as those produced at Measurement of Chromaticity) were produced using the phosphor dispersion liquids prepared in the aforementioned Samples 1 to 19 to measure the total luminous flux values thereof. The ratio of the total luminous flux value in each of Examples and Comparative Examples to the total luminous flux value of the sample in each of the corresponding to Examples and Comparative Examples was determined. This ratio was evaluated as follows. The results are given in Tables 1 and 2.

A: The ratio is 98% or more
B: The ratio is 96% or more, and less than 98%
C: The ratio is 94% or more, and less than 96%
D: The ratio is less than 94%

It is noted that the case where the ratio is 94% or more is a practically allowable level.

TABLE 1

| | | First Dispersion Liquid | | | | | | | | | | |
|---|---|---|---|---|---|---|---|---|---|---|---|---|
| | | Solvent | | | | Laminar Clay Mineral | | | Oxide Microparticles | | | |
| | | PG | 1,3-BD | IPA | EtOH | SWN | MK-100 | Kunipia F | BEN-GEL | RX 300 | Sylysia 470 | SP-1 | SS-50F |
| Comp. Ex. | Sample 1 | 70 | 30 | 50 | | | | | 3 | | 4.5 | | |
| Ex. | Sample 2 | 70 | 30 | 50 | | | | | 3 | | 4.5 | | |
| | Sample 3 | 70 | 30 | 50 | | | | | 3 | | 4.5 | | |
| | Sample 4 | 70 | 30 | 50 | | | | | 3 | | 4.5 | | |
| Comp. Ex. | Sample 5 | 70 | 30 | 50 | | | | | 3 | | 4.5 | | |
| Ex. | Sample 6 | 70 | 30 | 50 | | | | | 3 | | 4.5 | | |
| | Sample 7 | 70 | 30 | 50 | | | | | 3 | | 4.5 | | |
| | Sample 8 | 70 | 30 | 50 | | | | | 3 | | 4.5 | | |
| | Sample 9 | 70 | 30 | 50 | | | | | 3 | | 4.5 | | |
| | Sample 10 | 70 | 30 | 50 | | | | | 3 | | 4.5 | | |

| | | First Dispersion Liquid | | Phosphor Dispersion Liquid | | | | Evaluation | |
|---|---|---|---|---|---|---|---|---|---|
| | | Dispersing Machine | Viscosity mPa·s | Phosphor | Mixer | Viscosity mPa·s | Settling | Chromaticity Variation | Total Luminous Flux Value Ratio % |
| | Phosphor | | | | | | | | |
| Comp. Ex. | Sample 1 | TK Auto Homomixer | 45 | 90 | Awatori Rentaro | 100 | 2 mm | D | A (98%) |
| Ex. | Sample 2 | TK Auto Homomixer | 55 | 90 | Awatori Rentaro | 130 | None | B | A (98%) |

TABLE 1-continued

| | Sample | Dispersing Machine | Viscosity | Phosphor | Mixer | Viscosity | Settling | Chromaticity Variation | Total Luminous Flux Value Ratio % |
|---|---|---|---|---|---|---|---|---|---|
| | Sample 3 | TK Auto Homomixer | 200 | 90 | Awatori Rentaro | 280 | None | A | A (98%) |
| | Sample 4 | TK Auto Homomixer | 450 | 90 | Awatori Rentaro | 510 | None | B | B (97%) |
| Comp. Ex. | Sample 5 | TK Auto Homomixer | 550 | 90 | Awatori Rentaro | 600 | None | D | B (97%) |
| Ex. | Sample 6 | TK Auto Homomixer | 200 | 90 | TK Auto Homomixer | 230 | None | A | C (94%) |
| | Sample 7 | TK Auto Homomixer | 200 | 90 | Rocking Mixer | 260 | None | A | A (98%) |
| | Sample 8 | TK Auto Homomixer | 200 | 90 | Rocking Mill | 260 | None | A | B (97%) |
| | Sample 9 | TK Auto Homomixer | 200 | 90 | Mix Rotor | 270 | None | A | A (99%) |
| | Sample 10 | TK Auto Homomixer | 200 | 90 | Shaking Incubator | 240 | None | A | B (97%) |

TABLE 2

| | | First Dispersion Liquid | | | | | | | | | | | |
|---|---|---|---|---|---|---|---|---|---|---|---|---|---|
| | | Solvent | | | | Laminar Clay Mineral | | | | Oxide Microparticles | | | |
| | | PG | 1,3-BD | IPA | EtOH | SWN | MK-100 | Kunipia F | BEN-GEL | RX 300 | Sylysia 470 | SP-1 | SS-50F |
| Ex. | Sample 11 | 100 | | | 50 | | | | 4 | | | 4 | |
| | Sample 12 | | 90 | 60 | | | 2.5 | | | 4 | | | |
| | Sample 13 | 70 | | 30 | 50 | | | 3 | | | | | 4.5 |
| | Sample 14 | | 90 | 30 | 30 | 3 | | | | | | 4 | |
| | Sample 15 | 40 | 40 | 80 | | 4 | | | | | 5 | | |
| Comp. Ex. | Sample 16 | 70 | | 30 | 50 | | | | 3 | | 4.5 | | |
| | Sample 17 | 70 | | 30 | 50 | | | | 3 | | 4.5 | | |
| | Sample 18 | 70 | | 30 | 50 | | | | 3 | | 4.5 | | |
| | Sample 19 | 70 | | 30 | 50 | | | | 3 | | 4.5 | | |

| | | First Dispersion Liquid | | | Phosphor Dispersion Liquid | | | Evaluation | | |
|---|---|---|---|---|---|---|---|---|---|---|
| | | Phosphor | Dispersing Machine | Viscosity mPa·s | Phosphor | Mixer | Viscosity mPa·s | Settling | Chromaticity Variation | Total Luminous Flux Value Ratio % |
| Ex. | Sample 11 | | TK Filmix | 280 | 90 | Awatori Rentaro | 400 | None | B | B (97%) |
| | Sample 12 | | Apex Mill | 250 | 90 | Awatori Rentaro | 350 | None | A | B (97%) |
| | Sample 13 | | Cleamix | 200 | 90 | Awatori Rentaro | 280 | None | A | A (98%) |
| | Sample 14 | | Nano mizer | 180 | 90 | Awatori Rentaro | 250 | None | B | B (97%) |
| | Sample 15 | | ULTRA-TURRAX | 150 | 90 | Awatori Rentaro | 200 | None | B | A (98%) |
| Comp. Ex. | Sample 16 | 90 | TK Auto Homomixer | — | — | — (Collective Dispersion) | 250 | None | A | D (92%) |
| | Sample 17 | 90 | Awatori Rentaro | — | — | — (Collective Dispersion) | 60 | *1 — | — | — |
| | Sample 18 | | Awatori Rentaro | 30 | 90 | TK Auto Homomixer | 180 | None | B | D (93%) |
| | Sample 19 | | Awatori Rentaro | 30 | 90 | Awatori Rentaro | 60 | *1 — | — | — |

[Evaluation Results]

As seen from Tables 1 and 2, in the phosphor dispersion liquids of Samples 2 to 4, and 6 to 15, which were obtained by preparing the first dispersion liquid containing laminar clay mineral particles, oxide microparticles and a solvent so as to have a viscosity within a range of 50 to 500 mPa·s followed by dispersing of phosphor particles, no settling of phosphor particles was observed. In addition, there was less chromaticity variation in the LED devices manufactured using these phosphor dispersion liquids. It is deduced that sufficient dispersion of components other than phosphors at the time of preparing the first dispersion liquid allowed phosphor particles to be better dispersed.

Further, in particular, when the dispersion of phosphor particles was carried out using various apparatuses that do not apply a shearing force, for example, Awatori Rentaro, Rocking Mixer, or the like (Samples 2 to 4, and 7 to 15), the ratio of the total luminous flux value was very high. It is deduced that, since a shearing force was not applied at the time of dispersing phosphor particles, phosphor particles were not deteriorated. In contrast thereto, when the preparation of the first dispersion liquid and the dispersion of the phosphor particles were both carried out using TK Auto Homomixer; i.e., by applying a shearing force (Sample 6), the total luminous flux value was somewhat lower. It is deduced that a higher shearing force was applied at the time of dispersing phosphor particles, causing a part of phosphor particles to be pulverized.

On the other hand, even where the first dispersion liquid was prepared and then phosphor particles were dispersed in the same manner, when the viscosity of the first dispersion liquid was less than 50 mPa·s (Sample 1), phosphor particles settled in the phosphor dispersion liquid. It is deduced that, when the viscosity of the first dispersion liquid is lower, the viscosity of the phosphor dispersion liquid to be obtained also becomes lower, causing phosphor particles to settle. Further, in Sample 1, phosphor particles settled also in the applicator of the phosphor dispersion liquid, and thus there occurred a variation in the chromaticity of light emanated by the LED device.

In contrast thereto, when the viscosity of the first dispersion liquid was set higher than 500 mPa·s (Sample 5), there occurred a variation in the chromaticity of light emanated by the LED device, although settling of phosphor particles did not occur. It is deduced that, since the viscosity of the first dispersion liquid was excessively high, phosphor particles were not dispersed sufficiently. Further, it is also deduced that, since the viscosity of the phosphor dispersion liquid was relatively high, it was difficult to uniformly apply the phosphor dispersion liquid from the spray applicator.

Further, when phosphor particles, laminar clay mineral particles, oxide microparticles, and a solvent were collectively dispersed using Awatori Rentaro; i.e., without applying a higher shearing force (Sample 17), phosphor particles resulted in completely settling. It is deduced that this method fails to enable phosphor particles or laminar clay mineral particles to be dispersed sufficiently.

In contrast thereto, when phosphor particles, laminar clay mineral particles, oxide microparticles, and a solvent were collectively dispersed using TK Auto Homomixer; i.e., by applying a shearing force (Sample 16), the phosphor particles did not settle, and thus no variation occurred in the chromaticity of the LED device. However, the total luminous flux value from the LED device was significantly lowered. It is deduced that a shearing force at the time of collective dispersion caused the phosphor particles to be deteriorated (pulverized).

Further, when a first dispersion liquid was prepared without applying a shearing force, and then the obtained first dispersion liquid was dispersed by applying a shearing force (Sample 18), the phosphor particles did not settle. However, the phosphor particles were deteriorated (pulverized) at the time of dispersing the phosphor particles, causing the total luminous flux value from the LED device to be lowered.

Further, when a first dispersion liquid was prepared without applying a shearing force, and then the obtained first dispersion liquid was dispersed without applying a shearing force (Sample 19), the phosphor particles resulted in completely settling. It is deduced that this method fails to enable laminar clay mineral particles and phosphor particles to be dispersed sufficiently.

INDUSTRIAL APPLICABILITY

In the phosphor dispersion liquid produced by the present invention, phosphor particles are not deteriorated. Further, the phosphor particles are hard to settle, allowing uniform dispersion state to be maintained. Therefore, an LED device manufactured using this phosphor dispersion liquid has a higher light coupling-out efficiency, and further has a uniform chromaticity of irradiation light. Therefore, it is applicable not only to indoor or outdoor lighting apparatuses, but also to applications requiring larger amount of light and chromaticity uniformity, such as an automobile headlight.

REFERENCE SIGNS LIST

1 Package
2 Metal Part
3 LED Chip
4 Interconnection
5 Bump Electrode
6 Wavelength Conversion Part
7 Transparent Resin Layer
100 LED Device

The invention claimed is:

1. A method of producing a phosphor dispersion liquid including phosphor particles, laminar clay mineral particles, oxide microparticles, and a solvent, the method comprising:
   mixing laminar clay mineral particles, oxide microparticles, and a solvent to prepare a first dispersion liquid having a viscosity of 50 to 500 mPa·s; and
   mixing phosphor particles into the first dispersion liquid.

2. The method according to claim 1, wherein
   the mixing of the laminar clay mineral particles, the oxide microparticles, and the solvent in the step of preparing the first dispersion liquid, and the mixing of the first dispersion liquid and the phosphor particles in the step of mixing the phosphor particles are carried out in different devices.

3. The method according to claim 1, wherein the mixing of the first dispersion liquid and the phosphor particles is carried out in any of devices selected from the group consisting of a rotation/revolution stirrer, a vibration stirrer, a tumbler rotary stirrer, a container rotary mixer, and a shaker.

4. The method according to claim 1, wherein the solvent is an aliphatic alcohol.

5. The method according to claim 1 wherein the laminar clay mineral particles are swellable clay mineral particles.

6. The method according to claim 1, wherein a viscosity of the phosphor dispersion liquid is 80 to 1,000 mPa~s.

7. The method according to claim 1, further comprising housing in a shipping container the first dispersion liquid prepared in the step of preparing the first dispersion liquid, wherein
- the shipping container can be attached to a device for mixing the first dispersion liquid and the phosphor particles, and
- the mixing of the first dispersion liquid and the phosphor particles in the step of mixing the phosphor particles is carried out in the shipping container.

8. A method of manufacturing an LED device, comprising:
preparing a phosphor dispersion liquid by the producing method according to claim 1 and;
applying the phosphor dispersion liquid onto an LED element to form a phosphor layer.

9. The method according to claim 8, comprising:
applying a translucent ceramic material composition including a translucent ceramic material and a solvent onto the phosphor layer; and
curing the translucent ceramic material to form a wavelength conversion part in which the phosphor layer is bound with a translucent ceramic.

10. The method according to claim 9, wherein the translucent ceramic material is polysiloxane.

11. The method according to claim 9, comprising applying a composition for a transparent resin layer including a transparent resin onto the wavelength conversion part to form a transparent resin layer.

* * * * *